United States Patent

Ruggiero et al.

Patent Number: 5,752,445
Date of Patent: May 19, 1998

[54] PRINTING MANTLE FOR PRINTING INDICIA ON CORRUGATED CARDBOARD SUBSTRATES

[75] Inventors: Ricardo A. Ruggiero; Ruben E. Palermo, both of Rosario, Argentina

[73] Assignee: All Graphic, S.R.L., Provincia De Santa Fe, Argentina

[21] Appl. No.: 719,526

[22] Filed: Sep. 26, 1996

[51] Int. Cl.⁶ .................................................. B41J 1/32
[52] U.S. Cl. ............................................. 101/486; 101/211
[58] Field of Search ........................... 101/486, 483, 101/481, 32, 28, 29, 211, 401.1, 415.1

[56] References Cited

U.S. PATENT DOCUMENTS

| | | | |
|---|---|---|---|
| 3,103,880 | 9/1963 | Sanford et al. | 101/DIG. 36 |
| 3,361,060 | 1/1968 | Hoexter et al. | 101/DIG. 36 |
| 3,594,910 | 7/1971 | Ross | 101/DIG. 36 |
| 4,520,389 | 5/1985 | Hornschuh | 101/DIG. 36 |
| 5,065,677 | 11/1991 | Leader, Jr. | 101/415.1 |
| 5,081,923 | 1/1992 | LaMantia et al. | 101/32 |
| 5,117,365 | 5/1992 | Jeschre et al. | 101/481 |
| 5,205,039 | 4/1993 | Ternes | 101/DIG. 36 |
| 5,272,980 | 12/1993 | Takeuchi et al. | 101/481 |
| 5,363,564 | 11/1994 | Harley et al. | 101/DIG. 36 |
| 5,479,853 | 1/1996 | Carroll et al. | 101/32 |
| 5,505,125 | 4/1996 | Kapolnek | 101/32 |
| 5,511,479 | 4/1996 | Rogovein et al. | 101/401.1 |

*Primary Examiner*—Eugene H. Eickholt
*Attorney, Agent, or Firm*—William B. Ritchie

[57] ABSTRACT

A printing machine includes a plurality of printing rolls for custom printing multi-coloured indicia or designs on corrugated cardboard boxes. Each roll prints with ink of a different colour to the others. The design is prepared on a computer using graphics design tools and separated into components of a specific colour each. The designs are distorted asymmetrically no compensate for curvature error and each component is printed on a separate sheet of polyester or other transparent, dimensionally stable material. In one preferred embodiment, outline indicia of each element in a design component is printed on the sheet. In another embodiment, to save time, coordinate marks and identification indicia are printed on the sheet. Dies corresponding to each element are manufactured separately. A printing mantle is assembled for each roll by affixing the dies in positions determined by the printed indicia. Each die-assembled printle mantle is mounted then to its corresponding roll and the cardboard box sheets are conveyed through the machine for each roll to print thereon the design elements of a corresponding colour. An apparatus is also disclosed for assembling the mantles.

19 Claims, 3 Drawing Sheets

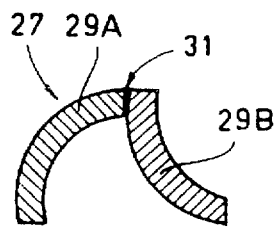
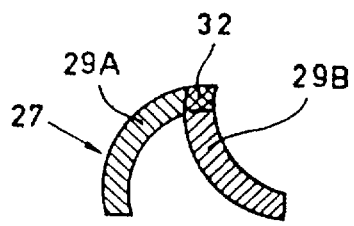
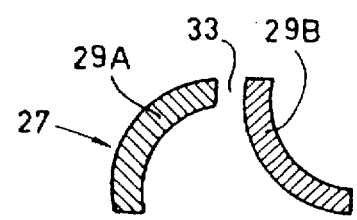
FIG. 2A    FIG. 2B    FIG. 2C
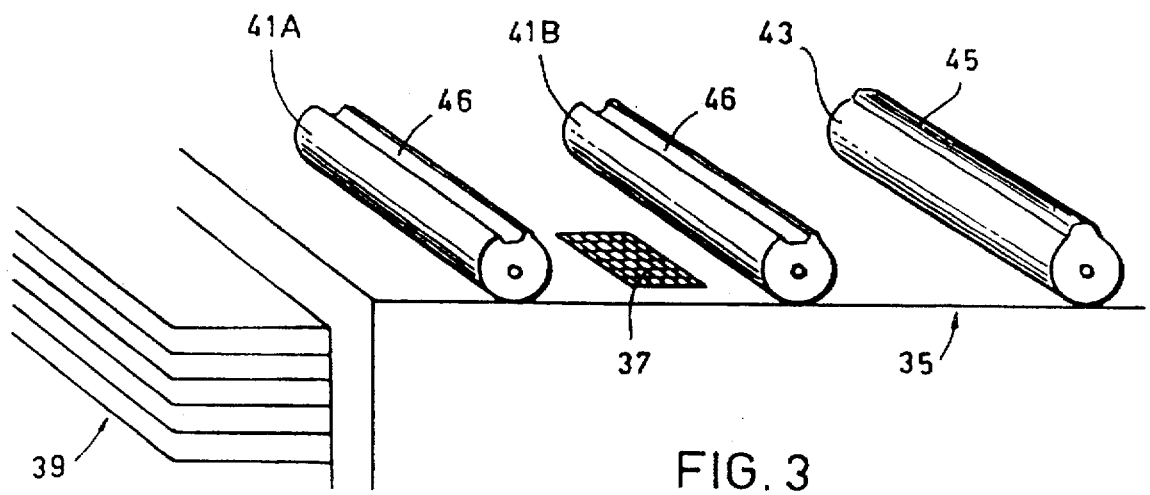
FIG. 3
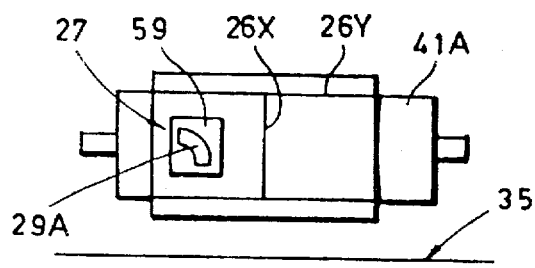
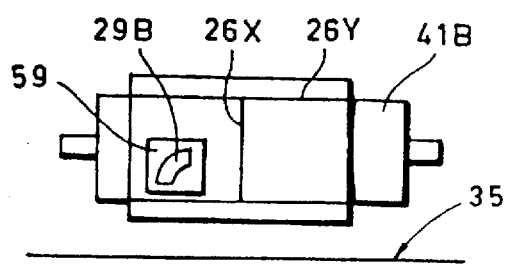
FIG. 4A    FIG. 4B

PRINTING MANTLE FOR PRINTING INDICIA ON CORRUGATED CARDBOARD SUBSTRATES

FIELD OF THE INVENTION

The present invention refers to printing a design or indicia on corrugated substrates, in particular to printing commercial graphic designs on surfaces of boxes made of corrugated cardboard, more particularly in connection with designs having more than one colour. Corrugated cardboard boxes so printed are commercially used for distributing a broad range of products and articles, such as cosmetics, medicines, foodstuffs, books, spare motor-car parts, household apparatus and so on.

In such cases, it is common for the boxes to have legends printed thereon, to identify the contents and provide information related therewith, in addition to logos and tradename information to identify the origin thereof as well as for publicity purposes. It is important that the printed design be clear and precisely located, particularly where two or more colours interface. In such regions, the colours should abut exactly with one another, that is, one colour should end right where the next one begins, without any overlay nor gaps in between. Millimetric, and sometimes submillimetric, offsets of one colour relative to another may be quickly visible to the naked eye and tarnish the appearance of the box and defeat the publicity end to some degree.

The production of corrugated-cardboard boxes with a coloured design printed thereon is preceded by several work-stages for carrying out the graphic design and preparing the dies which should then be assembled with extreme precision before the stage wherein the cardboard itself is printed. The design is carried out on a computer using dedicated graphic-design programs. The design may be drawn directly using the mouse and other computer tools or else obtained by scanning a sample sent by the customer. Once the design is finished, the computer puts it on paper for manufacturing the dies or relief plates.

The last stage, wherein the boxes are printed, is carried out by means of a machine having die-mounted rolls through which unfolded (open) corrugated cardboard sheets are fed. Each roll prints a predetermined colour, except for the last roll which has a cutter mounted thereon for marking the edges which define the future faces of the boxes. For economical and handling reasons mainly, in view of the size of the unfolded boxes, and because the boxes are never or rarely printed all over, the dies or relief plates are manufactured by parts and hence only occupy parts of the roll corresponding to regions of the boxes designed to carry a printed design element. Each die should be placed with extreme precision, a job which heretofore is carried out by hand.

In fact, the problems addressed by the present invention stem from the drawbacks encountered and amount of work required in assembling the dies to the rolls with the precise registration required by the resolution of the human eye. Since registration errors may also cause part of the design destined to a face shift over to the adjacent face, it is not only important that the colours be in registration with one another but that the designs, even if of just one colour, and design parts be in registration with the folding edges of the corrugated cardboard sheets output by the printing machine.

Furthermore, as soon as an entire lot has been prepared according to customer specifications, the whole arrangement is disassembled and stored, to pave the way for another job. Thus, each time a new order is received for a number of boxes with the same design specifications, it is necessary to repeat the entire task of reassembling the dies exactly in the same position as before. Hence, another drawback addressed by the present invention is related to the job of repeating the task of arranging the dies on the rolls to print out a design printed out some time ago.

A further inevitable complication in assembling the dies is the need to compensate cylindrical distortion errors resulting from the finite curvature radius of the roll surfaces. The distortion is asymmetric in the sense that the design is stretched in a direction transverse to the roll (that is, coinciding with the direction in which the cardboard sheets are conveyed) but not in the direction of the generatrix of the cylindrical surface of the rolls (or widthwise of the sheet). This distortion is obviously due to the finite thickness of the die and causes a, for example, circular image to be printed by a die que in an oval shape.

BACKGROUND OF THE INVENTION

Two methods are known for mounting the dies or relief plates to the rolls and trying to place each in a corresponding exact position so that each printed part is in registration with the others and with the substrate. The dies are manually mounted in both cases, which differ in the reference means used by the assemblyman to determine the exact position of each die on the corresponding roll. The determination of the exact position of each die is significantly hindered by the assemblyman having to compensate the aforesaid asymmetrical distortion between the paper design and the shape of the dies.

In the earlier of the two known methods the assemblyman exercises his particular expertise and knack to stick the dies on the rolls by trial and error. The dies are stuck on and unstuck repetitively, and test prints are carried out in between, until the exact placement is achieved. The method is cumbersome because of the man-hours needed and the registration and alignment errors which result in spite of the assemblyman's care. The work is entirely lost once the dies are disassembled from the rolls, that is it needs to be repeated for a later job, further resulting in differences between boxes printed in different batches.

The second method used in the art introduces mechanical elements to assist the manual operation. A printing mantle consisting of a blank polyester film or sheet is prepared. The entire design is printed on a paper sheet using a 1:1 scale. The assemblyman pastes the dies on the film or mantle, assisted by a machine including several gears and mirrors which enable the dies to be placed in positions which correct the asymmetrical distorsion caused by the roll curvature. Lastly, each mantle with its dies thereon is assembled to the corresponding roll.

This method carries over to some degree drawbacks of the earlier method, including human and mechanical errors, which become apparent on the box print. Assembly time is considerable and, moreover, the dies need to be manufactured before assembling the mantle.

On the other hand, the art of printing corrugated cardboard boxes has progressed substantially lately, becoming stricter in quality requirements and more complicated in the designs of indicia, in line with technological progress and modern tastes. This is noticeable in more complicated designs, which call for higher resolution in thinner traces and closer interelationship between different colours.

SUMMARY OF THE INVENTION

It is an object of the present invention to reduce the time it takes to assemble the dies on the respective rolls, with the aim of reducing the cost of printing substrates destined for boxes for packaging articles, without adversely affecting job precision and quality.

Another object of the invention is to improve the quality of print on boxes made of corrugated material, particularly the registration between colours of the design and their relationship to the edges of the box, without increasing machine time.

Yet another object of the invention is to provide an exact registration between parts of the design, particularly parts of different colours, without having to carry out multiple trial-and-error assembly cycles.

A further object of the same invention is to directly compensate, prior to assembling, asymmetrical errors resulting from the cylindrical curvature of the rolls.

These and other objects and advantages of the present invention are achieved by taking advantage of the fact that a drawing of the design is normally available already on a computer, either in a graphics file or scanned from a drawing made by hand, from the specification for manufacturing the dies. According to the invention, computer tools are used to divide the drawn design into separate files for each colour containing the parts of the design corresponding to a same colour. The error which would be due to the roll curvature radius is compensated before or afterwards. Each such monochromatic, compensated file is then accessed to print visible indicia on each printing mantle before mounting the latter to its respective roll.

According to an embodiment of the invention, such indicia correspond to actual single-colour representations of the design. Alternatively, just fragments of such design parts may be printed on the mantles. According to another embodiment, the indicia comprises coordinate marks which identify positions of the different dies, such as for instance, crosses centred on the position of each die accompanied by correlated numerals, fully leaving out all actual reproduction of the design parts or fragments thereof.

BREVE DESCRIPTION OF THE DRAWINGS

In the accompanying drawings:

FIG. 2A illustrates a primary object of the invention, which is to achieve exact registrations between interfacing parts of different colours of the design. On the other hand, FIGS. 2B and 2C illustrate registration errors avoided by the invented process.

FIG. 3 is a schematic of a printing machine, to illustrate the manner in which cardboard sheets are conveyed through the rolls thereof. A final roll is also schematically shown for pressing the cardboard.

FIGS. 4A and 4B illustrate relative die positions on different rolls corresponding to the design parts shown in FIG. 2A to achieve a corresponding registration between colour.

DETAILED DESCRIPTION OF PREFERERED EMBODIMENTS

Figure 1:
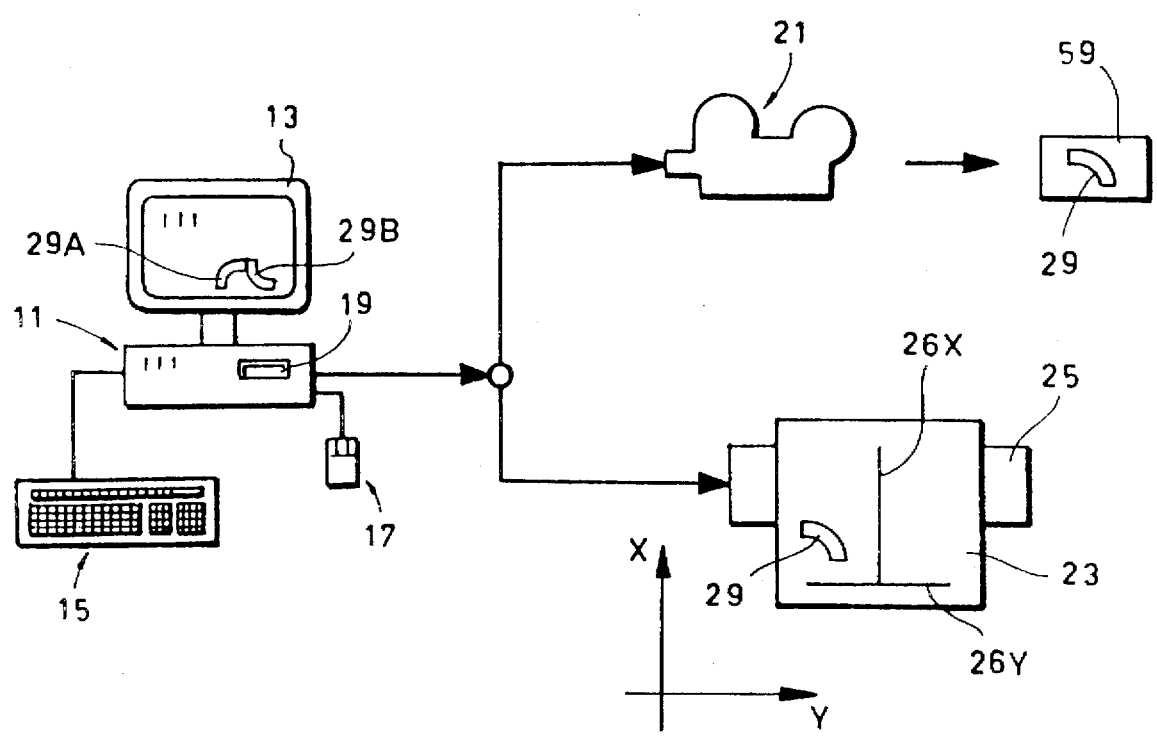
FIG. 1 is a block diagram setting forth the design development stage of the process of the invention and the files generated at this stage.

FIG. 1 shows a computer 11, such as a MacIntosh-type system or of the type commonly referred to as an IBM-compatible PC. The computer 11 is suitably programmed, for instance with one of the software packages known on the market as Photoshop 2.5, Illustrator 5.5 and Quark 3.2 for Macintosh computers. In the case of an IBM-type PC, a program such Corel Draw may be used with like satisfactory results. The designer draws the design to be printed in colour and to a 1:1 scale on a screen 13 of the computer 11, using an associated keyboard 15 or a two-dimension positioning means such as a mouse 17, as is conventional. The designer may be at the printers or belong to the customer or a contracted third party, such as a publicity consultant.

Once finished, the drawing, may be stored on a diskette or plotted. The latter is normally done anyhow for colour testing. The printer may scan the plot and load it onto a diskette in a disk-drive 19 of his computer 11 or else insert the diskette containing the prerecorded drawing file in the disk-drive 19 and read the file.

In either case, the computer 11 now contains the file with graphics codes according to the graphics program used. This file is suitably converted to an encapsulated or bit-mapped file, called EPS, in order that it may be read by other programs for plotting and printing plans. On one hand, a film composer or camera 21 is used to extract graphic information from the file and reproduce it on a film. The film is then developped using an automatic developper (not illustrated) to obtain a negative for manufactruing the printing dies from liquid resin, using conventional equipment. The die manufacture process is not described herein in greater detail since is well known in the art and does not form an essential part of the invention. The choice of using resin for the dies has the advantage of producing transparent dies o relief plates, the usefulness of which is apparent hereinafter where refering to FIG. 5A.

The novelty of the invention lies in obtaining rolls having dies or relief plates assembled thereon in exact registration, which is indispensable if good quality printing is required on boxes for packaging products. The problem overcome by the invention is graphically shown in the FIGS. 2A, 2B and 2C. FIG. 2A represents a possible two-colour graphic design 27, comprising a blue design component 29A and a black design component 29B, for example. The specifications provided by the customer for printing the corrugated cardboard boxes require that the pair of differently-coloured design components 29 have to be exactly in registration with each other, that is, the transition 31 from one colour to the other should appear to be continuous, at first glance at least. Since each colour is separately printed on the cardboard, any offset of one colour relative to the other may result in overlap 32 of the blue element over the black element, as FIG. 2B illustrates, or else cause a gap 33 in between both design components 29, as FIG. 2C illustrates. These defects 32 are 33 are undesirable and may be repeated through the entire batch of printed boxes, leading to the entire production being rejected by the customer and consequential waste of time and materials.

Figures 6A, 6B:
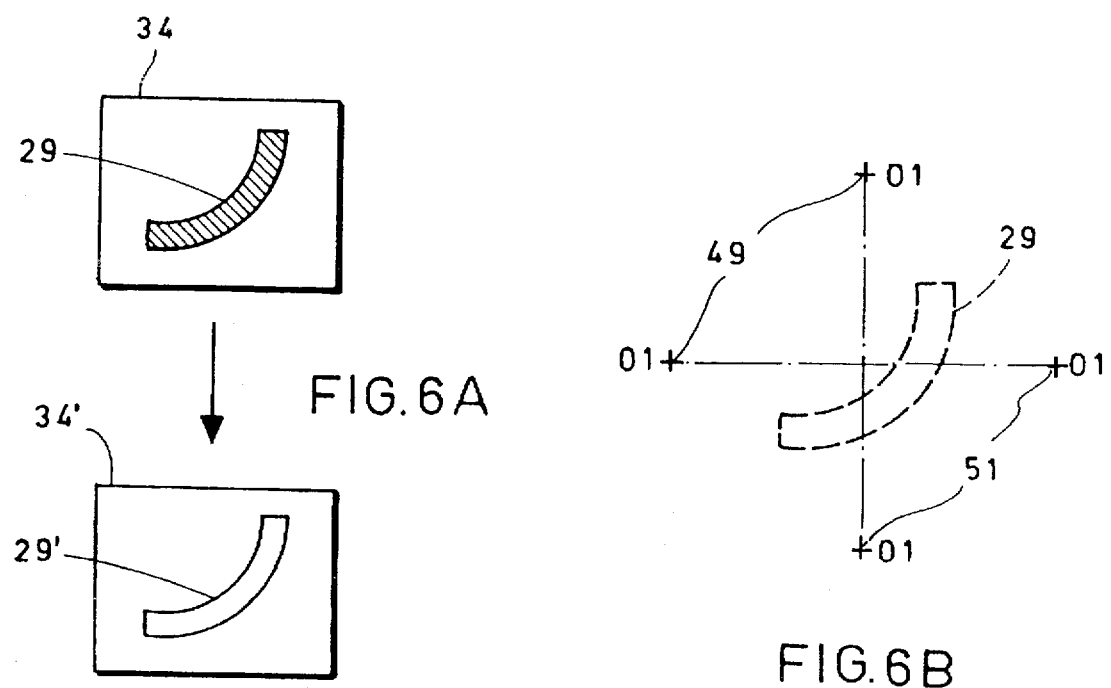
FIG. 6A illustrates the conversion of the graphic design file containing the full picture of a design part into an outline map used as a positional reference indicia for the corresponding die.
FIG. 6B illustrates the use of coordinate marks as positional reference indicia for the dies.

The invention uses files derived by the computer 11 from the same graphics design file used to generate the specifications for manufacturing the dies, enabling the assembly-man to place each die in its exact position, thus producing a high quality result as illustrated in FIG. 2A. Referring back to FIG. 1, a program known as Flexicut reads the incapsulated EPS codes. Under this program, the graphic information of the full design is converted into outline information for each design element or part 29, as shown in FIG. 6A wherein the file 34 contains the codes of the map of the design element 29 generated by the graphics program, which the Flexicut program has converted to a file 34' containing codes for mapping the outline 29'of the design 29.

This program may be used to deform the design along one coordinate axis relative to the other, to stretch the entire image, by about 2 to 8% according to the diameter of the rolls (described hereinafter) in the X-direction (corresponding to the substrate conveyance direction) relative to the Y-direction (or substrate width), to compensate the asymmetrical distortion or parallax caused by the cylindrical surfaces of the printer rolls. Alternatively, the distortion may be introduced using tools in the graphics program before operating the Flexicut program. Both programs conventionally include tools to this effect, which generally consist in rolling down a command window and resealing the X-direction by the required percentage. This percentage may be calculated as the die width divided by the roll radius.

Thereafter, drawing information is separated by colour, using diverse software techniques and tools in the program, and a file, which may be termed a monochromatic file, is generated for each. The next step consists of printing out each monochromatic file on a respective sheet 23 of polyester, 200-microns thick, the face dimensions of which may be 2 meters by 1 meter, approximately. Of course, sheets of other suitable dimensions or materials may be used, as long as they are dimensionally stable. Each sheet 23 is thus printed with a monochromatic image 29 corresponding to parts of a same colour of the design. To this end, the Flexicut program successively transmits each monochromatic encapsulated file to a plotter 25.

Instead of the apparatus 25, we have found that a cutter, as commonly used for cutting vinyl, may be advantageously adapted to trace the design components 29 on the respective sheets 23, instead of cutting. To this end, the blade normally found on the cutter 25 is replaced by a pen fitted to the blade-holder in a manner conventionally utilized for test-marking vinyl before cutting.

Using the same program, the cutter cum tracer 25 also plots a transversal line 26Y on each sheet 23 at the top margin of the drawing and, preferably, another, longitudinal line 26X bisecting the drawing, advantageously coinciding with the position of a box edge-to-be passing through the middle of the unfolded sheet 37. Both lines 26 (alphabetical suffixes are omitted from reference numerals when generalizing herein) are traced on every sheet 23 in exactly the same place relative to the overall design.

It is worthwhile to prepare the printing mantles 23 with the adapted cutter 25 while the dies are being manufactured, to save valuable work time.

A printing machine 35 is used for the job of printing the boxes. The printing machine 35 conveys sheets 37 of corrugated cardboard arranged in a pile 39 one by one to a die-mounted roll 41A printing with blue-coloured ink, a second die-mounted roll 41B printing with black ink and, lastly, a cutting roll 43 having sharp blades 45 installed thereon to mark the edges-to-be on the cardboard substrate 37. The die-mounted rolls 41 are provided with generatricial reference slots 46 in registration with one another. Naturally, the machine 35 may include more rolls (not illustrated) between the second die-mounted roll 41B and the cutting roll 43 to enable working with three or more coloures. Such additional rolls may left out of service when less colours are used for a particular design.

The resin dies are assembled as illustrated in FIGS. 4A and 4B. Each die or relief plate is shaped to an element or part 47 of a monochromatic design component. Each printing mantle 23 is assembled with its respective dies o relief plates on a corresponding roll 41. The assemblyman's task thereafter consists of positioning and sticking each die on the corresponding mantle 23, which he carries out by referring directly to the reference traces 29 of the drawing, without resort to trial-and-error nor repeatedly test-printing. In order to register the mantles 23 with one another on the rolls 41, a rod 48 is attached to each sheet to coincide with the crossline 26Y thereon. The dimensions of the rod 48 are such that it may fit into the roll slot 46 and provide a longitudinal reference for mounting the printing mantles 23 on the corresponding rolls 41.

Figures 5A, 5B:
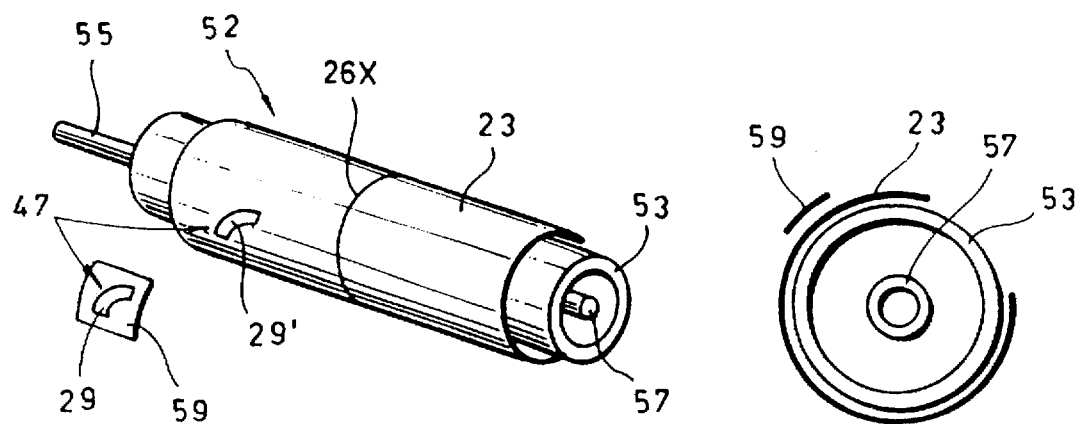
FIGS. 5A and 5B show respective elevation and cross-section views of a roll on which the printing mantle with the dies assembled thereon is mounted.

Referring to the task of assembling the dies on the sheets 23, we have developped an assembler apparatus 52 shown in FIGS. 5A and 5B for making this operation swifter and easier and enhance precision thereof. The apparatus 52 comprises a hollow roll 53 made of a transparent acrylic material and rotably mounted on a shaft 55. The diameter of the assembly roll 53 is substantially the same as the diameter of the printing rolls 41. A fluorescent tube 57 is housed inside the roll 53, although other illuminator means may be used such as a group of incandescent lamps arranged to produce diffues light.

The assemblyman places each printing mantle 23 in turn on the transparent roll 53 and turns the light 57 on in order to be able to see each of the elemental outlines 29' of the monochromatic images drawn by the cutter on the polyester sheet 23. Then he places each die or relief plate part 59 in its exact position on the sheet 23, guided by the underlying outline 29'. Each mantle 23 is assembled in this manner with its dies 59 in the positions dictated by the outlines 29'. In the next step, the printing mantles 23 are mounted to the corresponding rolls 41, first placing each rod 48 in the slot 46 of the roll 41 corresponding thereto to achieve the longitudinal registration and then wrapping the mantle 23 around the cylindrical surface of the roll 41.

The rolls 41 may include circumferencial lines (not illustrated) at predetermined latitude positions on their cylindrical surfaces. Transversal registration, just as important as the longitudinal one, is achieved by having the longitudinal line 26X previously marked by the cutter 25 coincide with a certain latitude line on each roll 41. This latitude line on the rolls 41 is also made to coincide with the edge between the second and third (as seen transversally) box faces on the sheet 37 conveyed from the supply pile 39.

Alternatively, the rolls 41 may be unmarked insofar circumferential lines and the step of plotting the longitudinal trace 26X with the cutter 25 in the sheet 23 printing stage may be omitted. In this case, transversal registration is attainable by shifting the rolls 41 axially in the degree necessary, using fine axial adjustment screw devices (not shown) conventionally found on machines 35 for each printing roll 41.

FIG. 6B illustrates an alternative embodiment using the computer 11, by means of the Flexicut program or other graphic design programmes loaded thereon, to generate reference crosses 49 and correlation data in the form of two-digit number codes 51 assigned in numerical order to refer the positions of the design parts 47 on the printing mantle. A set of four crosses 49 is placed next to each number 51 of the set in an arrangement centred around the respective element of the design 47, in other words in diametrically opposed pairs. The actual picture 29 of the design 47 may also be drawn on the sheet 23 in full, just fragmentarily or else completely left out to accelerate the procedure, the crosses 49 acting as position indications or references of the dies and the number codes 51 as identification thereof.

In the embodiments disclosed herein, boxes printed with multicoloured indicia or designs may be obtained, enjoying excellent registration between the different colours and design elements, taking up much less time for preparation and assembling in comparison to conventional processes known heretofore. Of course, variations and changes may be adapted to the illustrated embodiments but without departing from the purview of the appended claims.

We claim:

1. A process for printing a design on a substrate provided in sheet form, using a printing machine including at least one printing roll, said design comprising a plurality of elements, each such roll adapted for mounting a respective set of dies associated therewith, each of said dies further including an inkable surface relief shaped to a respective one of said design elements, each of said die-assembled rolls being associated with a design component comprised by said design parts of said dies associated therewith; said process comprising the steps of:

providing respective sheets of a dimensionally stable material for preparing a printing mantle for each printing roll;

generating first indicia positionally related to at least some of said design parts;

for each one of said printing mantles, visibly marking said first indicia related to a same design component on said respective sheet;

assembling each one of said printing mantles by affixing said associated dies on said respective sheet in individual positions and orientations determined by said first indicia and wrapping said respective sheet around said associated roll; and successively conveying said substrate sheets through said rolls to print said design on each one thereof.

2. A process for printing a design according to claim 1, wherein said first indicia is positioned to further compensate for asymmetrical errors due to the cylindrical curvature of said rolls and the thickness of said dies.

3. A process for printing a multicoloured design, using a printing machine including a plurality of said die-assembled rolls, according to claim 1, wherein said design is divided up into component sets of said design elements according to a predetermined colour and first indicia corresponding to only one of said design colours is marked on each one of said sheets.

4. A process for printing a design according to claim 3, wherein second indicia is printed on each one of said sheets in a same predetermined position and said second indicia are used in said wrapping step as common positional references for placing each one of said printing mantles on said respective rolls.

5. A process for printing a design according to claim 4, each of said rolls including a reference generatricial mark thereon in longitudinal registration with the generatricial marks of the other rolls, wherein said second indicia includes a transversal trace marking a margin of said design and in said wrapping step said trace is made to coincide with the reference mark on said roll.

6. A process for printing a design according to claim 4, each of said rolls including a circumferencial reference mark thereon in transverse registration with the circumferencial marks of the the other rolls, wherein said second indicia includes a longitudinal trace bisecting said design and in said wrapping step said longitudinal trace is made to coincide with the circumferencial reference mark on said roll.

7. A process for printing a design according to claim 1, wherein said first indicia includes respective outline elements of each one of said design elements and said step of visibly marking each one of said printing mantles with said outline elements is carried out with a cutter adapted to operate as a plotter.

8. A process for printing a design according to claim 1, wherein said first indicia includes characters respectively identifying said design elements.

9. A process for printing a design according to claim 1, wherein said first indicia includes coordinate marks corresponding to each one of said design elements, the coordinate marks including an array of crosses arranged to mark the position de each one of said design elements and an identification numeral associated with each one of said crosses.

10. A process for printing a design according to claim 1, wherein said design is generated in a suitably programmed computer and said first indicia is generated by said computer for each design element, and said computer prints on each one of said sheets said design elements pertaining to a respective one of said design components.

11. A process for printing a design according to claim 1, said substrate destinated to form a box having several faces and said machine including a plurality of said printing rolls successively situated in the path in which said substrate sheets are conveyed and a cutting roll at the end of said path and adapted for marking folding lines between adjacent ones of said faces, wherein said design is printed in between said lineas.

12. A process for printing a design according to claim 1, said dies being of transparent material, wherein said dimensionally stable material is also transparent and said assembly step is carried out on an assembly roll having dimensions similar to said printing rolls, said transparent assembly roll further housing illuminating means therein to enhance vision during said assembly step.

13. A process for assembling a plurality of printing mantles for use in a machine for printing a multicoloured design on a substrate supplied in sheet form, said printing machine including a plurality of printing rolls adapted for mounting respectives ones of said printing mantles having dies assembled thereon, each one of said dies having a face shaped to print at least a part of a respective colour of said design; said process comprising the steps of:

preparing respective sheets of dimensionally stable material as bases for said printing mantles;

generating said design in colours on a computer including software and tools suitable for graphics design;

distorting said design bidimensionally to compensate for asymmetrical errors due to the cylindrical curvature of said rolls and the thickness of said dies;

divide, using said computer, said multicoloured design into respective design components each of a different one of said colours;

divide, using said computer, each design component into design elements corresponding to said parts and generate first indicia corresponding to each element; and visibly reproducing each one of said first indicia corresponding to a respective design component on a respective one of said sheets;

whereby each one of said dies can be mounted on a respective one of said printing mantles in corresponding positions identified by said first indicia.

14. A process for assembling according to claim 13, wherein said step of generating first indicia comprises operating said computer to trace respective outline elements of each one of said parts of each design component by means of a cutter adapted to operate as a plotter.

15. A process for assembling according to claim 13, wherein said step of generating first indicia comprises operating said computer to trace respective sets of positioning marks situated to mark the position of each one of said design elements and visually associate each one of said marks with a character string identifying said set of marks.

16. A process for assembling according to claim 13, said rolls including a reference slot each at respective generatrices in registration with one another, wherein said process further includes the steps of:

generate second indicia in said design using said computer, said second indicia including a transversal trace on an edge of said design and a longitudinal trace bisecting said design, and printing said second indicia on each one of said sheets in a same position relative to said design;

and said step of mounting each mantle on the respective roll comprises affixing a rod to said mantle to coincide with said transversal trace and inserting said rod in said roll slot.

17. A process for assembling according to claim 13, wherein said asymmetrical error compensating step comprises rescaling a coordinate axis by a degree determined by the thickness of said dies divided by the cylindrical curvature radius of said rolls and keeping the scale of the coordinate axis orthogonal thereto constant.

18. A process for assembling according to claim 13, wherein said dimensionally stable material is transparent polyester.

19. A printing mantle obtained by the process of claim 1 or 13.

* * * * *